United States Patent
Kung

(10) Patent No.: US 9,066,458 B2
(45) Date of Patent: Jun. 23, 2015

(54) FABRICATING METHOD OF CIRCUIT BOARD AND CIRCUIT BOARD

(75) Inventor: Chen-Yueh Kung, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 54 days.

(21) Appl. No.: 13/544,994

(22) Filed: Jul. 10, 2012

(65) Prior Publication Data
US 2013/0213692 A1      Aug. 22, 2013

(30) Foreign Application Priority Data
Feb. 16, 2012   (TW) .............................. 101105080 A

(51) Int. Cl.
| | |
|---|---|
| H05K 7/10 | (2006.01) |
| H05K 3/40 | (2006.01) |
| H05K 1/11 | (2006.01) |
| H05K 3/28 | (2006.01) |
| H05K 3/10 | (2006.01) |
| H05K 3/34 | (2006.01) |
| H01L 23/00 | (2006.01) |

(52) U.S. Cl.
CPC .............. *H05K 3/4007* (2013.01); *H05K 1/111* (2013.01); *H05K 3/108* (2013.01); *H05K 3/28* (2013.01); *H05K 3/3452* (2013.01); *H05K 2201/0341* (2013.01); *H05K 2201/099* (2013.01); *H05K 2203/0588* (2013.01); *H05K 2203/1383* (2013.01); *H01L 24/13* (2013.01); *H01L 24/16* (2013.01); *H01L 24/81* (2013.01); *H01L 2224/13101* (2013.01); *H01L 2224/16225* (2013.01); *H01L 2224/81193* (2013.01)

(58) Field of Classification Search
None
See application file for complete search history.

(56) References Cited

U.S. PATENT DOCUMENTS

| | | | | |
|---|---|---|---|---|
| 2001/0047881 | A1* | 12/2001 | Wakako et al. | 174/255 |
| 2008/0083560 | A1* | 4/2008 | Saiki et al. | 174/255 |
| 2008/0093109 | A1* | 4/2008 | Hsu et al. | 174/250 |
| 2008/0158841 | A1* | 7/2008 | Inagaki et al. | 361/782 |
| 2009/0020322 | A1* | 1/2009 | Hsu | 174/257 |
| 2009/0032294 | A1* | 2/2009 | Hsu | 174/257 |
| 2010/0126758 | A1* | 5/2010 | Akai et al. | 174/257 |
| 2010/0261348 | A1* | 10/2010 | Yoon et al. | 438/672 |
| 2010/0319966 | A1* | 12/2010 | Liu | 174/255 |
| 2011/0232951 | A1* | 9/2011 | Maeda et al. | 174/257 |
| 2012/0067635 | A1* | 3/2012 | Nang et al. | 174/260 |

FOREIGN PATENT DOCUMENTS

| | | |
|---|---|---|
| TW | I305406 | 1/2009 |
| TW | 201117689 | 5/2011 |
| TW | I351087 | 10/2011 |

OTHER PUBLICATIONS

"Office Action of Taiwan Counterpart Application", issued on Nov. 21, 2013, p. 1-p. 12.

* cited by examiner

*Primary Examiner* — Tuan T Dinh
*Assistant Examiner* — Steven T Sawyer
(74) *Attorney, Agent, or Firm* — Jianq Chyun IP Office

(57) ABSTRACT

A method of fabricating a circuit board includes the following steps. A first and a second patterned conductive layer are plated on the first and the second surface of a core substrate, respectively. A first and a second extending pad are individually plated on a first and a second pad of the first and the second patterned conductive layer, respectively. A first and a second thermal-curing type dielectric layer are individually formed on the first and the second surface to cover the first and the second patterned conductive layer and the first and the second extending pad, respectively. A portion of the first and the second thermal-curing type dielectric layer respectively covering the top of the first and the second extending pad are removed. A protective film covers the second extending pad. The extending pad is removed by an etching process.

21 Claims, 9 Drawing Sheets

FABRICATING METHOD OF CIRCUIT BOARD AND CIRCUIT BOARD

CROSS-REFERENCE TO RELATED APPLICATION

This application claims the priority benefit of Taiwan application serial no. 101105080, filed on Feb. 16, 2012. The entirety of the above-mentioned patent application is hereby incorporated by reference herein and made a part of this specification.

BACKGROUND OF THE INVENTION

1. Field of the Invention

The present invention relates to a circuit board of semiconductor package and a method for fabricating the same.

2. Description of Related Art

In current semiconductor packaging technology, chip carriers are commonly used for the interconnection between integrated circuit (IC or chip) and the next-leveled electronic components, such as mother boards, module boards or the like. Circuit boards are generally used in the chip carriers with high I/O count. A conventional circuit board is mainly composed of a plurality of patterned conductive layers and a plurality of dielectric layers alternately stacked to one another. And, the patterned conductive layers are electrically connected through a plurality of conductive vias.

Flip-chip bonding process is a packaging process applied on IC having high I/O count, wherein the IC can be connected to the circuit board through a plurality of conductive bumps arranged in array. In addition, ball grid array (BGA) is another packaging process applied on circuit boards having high I/O count, wherein the circuit board can be electrically connected to the next-leveled electronic component through a plurality of conductive balls (e.g., solder balls) arranged in array.

One surface of the circuit board is disposed with bump pads for jointing the bumps and the opposite surface of the circuit broad is disposed with solder ball pads for jointing the conductive balls. The pads including the bump pads and the ball pads can be classified into two types: solder mask define (SMD) and non-solder mask define (NSMD), depending on whether the pads are covered by the solder mask or not.

SUMMARY OF THE INVENTION

The present invention provides a method for fabricating a circuit board having solder mask define type of pads (SMD pads) and/or non-solder mask define type of pads (NSMD pads).

The present invention provides a circuit board having SMD pads and/or NSMD pads.

The present invention further provides a method of fabricating a circuit board. The method includes the following steps. First, a core substrate is provided, wherein the core substrate has a first surface and a second surface opposite to the first surface. A first patterned photoresist layer is formed on the first surface. A second patterned photoresist layer is formed on the second surface. Then, a first patterned conductive layer is plated on the first surface exposed by the first patterned photoresist layer, wherein the first patterned conductive layer has a first pad. And then, a second patterned conductive layer is plated on the second surface exposed by the second patterned photoresist layer, wherein the second patterned conductive layer has a second pad.

After that, a third patterned photoresist layer is formed on the first patterned photoresist layer and the first patterned conductive layer, wherein the third patterned photoresist layer exposes the first pad. A fourth patterned photoresist layer is formed on the second patterned photoresist layer and the second patterned conductive layer, wherein the fourth patterned photoresist layer exposes the second pad. A first extending pad is plated on the first pad exposed by the third patterned photoresist layer. A second extending pad is plated on the second pad exposed by the fourth patterned photoresist layer.

Then, the first patterned photoresist layer, the second patterned photoresist layer, the third patterned photoresist layer and the fourth patterned photoresist layer are removed. A first thermal-curing type dielectric layer is formed on the first surface, wherein the first thermal-curing type dielectric layer covers the first patterned conductive layer and the first extending pad. A second thermal-curing type dielectric layer is formed on the second surface, wherein the second thermal-curing type dielectric layer covers the second patterned conductive layer and the second extending pad.

Finally, a portion of the first thermal-curing type dielectric layer covering the top of the first extending pad is removed. A portion of the second thermal-curing type dielectric layer covering the top of the second extending pad is removed. The first extending pad is removed.

The present invention provides a circuit board including a core substrate, a first patterned conductive layer, a second patterned conductive layer, an extending pad, a first thermal-curing type dielectric layer and a second thermal-curing type dielectric layer. The core substrate has a first surface and a second surface opposite to the first surface. The first patterned conductive layer is disposed on the first surface and has a first pad. The second patterned conductive layer is disposed on the second surface and has a second pad. The extending pad is disposed on the second pad, wherein the outer diameter of the extending pad is smaller than the outer diameter of the second pad. The first thermal-curing type dielectric layer is disposed on the first surface and covers the first patterned conductive layer but exposes the first pad. The second thermal-curing type dielectric layer is disposed on the second surface, covers the second patterned conductive layer and exposes the extending pad.

In light of the above, the method of the present invention is capable of fabricating a circuit board having solder mask define type pads (SMD pads) and/or non-solder mask define type pads (NSMD pads), and the above mentioned pads are concave to the surface of the circuit board to avoid causing scratches on the pad surface. The aforementioned solder mask is a thermal-curing type dielectric layer.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
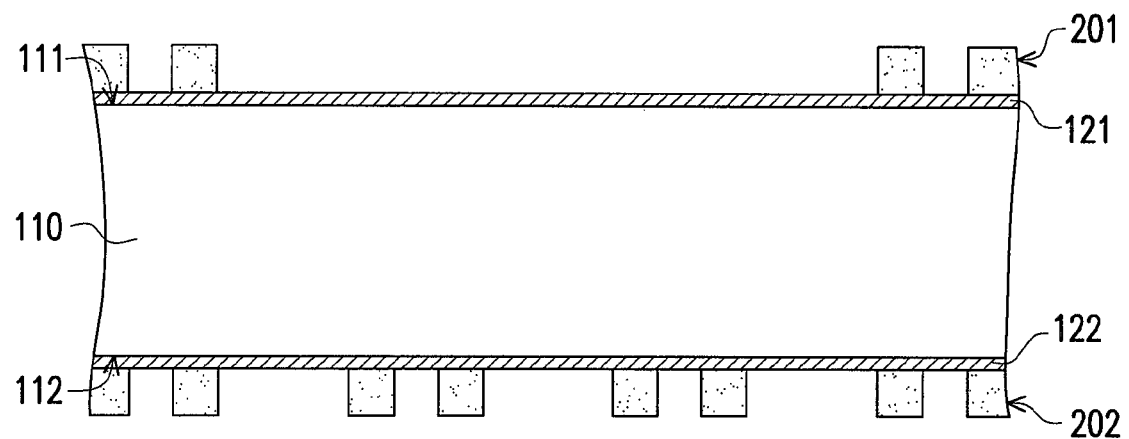
FIG. 1A to FIG. 1L are cross-sectional views illustrating a fabrication process of a circuit board according to an embodiment of the present invention.

FIG. 1A to FIG. 1L are cross-sectional views illustrating a fabrication process of a circuit board according to an embodiment of the present invention. First, referring to FIG. 1A, a core substrate 110 is provided. In the embodiment, the core substrate 110 may be composed of a plurality of patterned conductive layers and a plurality of dielectric layers alternately stacked to one another. In addition, the patterned conductive layers are electrically connected through a plurality of conductive vias.

The core substrate 110 has a first surface 111 and a second surface 112 opposite to the first surface 111. A first seed layer 121 is formed on the first surface 111 and a second seed layer 122 is formed on the second surface 112. Then, a first patterned photoresist layer 201 is formed on the first seed layer 121 and a second patterned photoresist layer 202 is formed on the second seed layer 122.

Figure 1B:
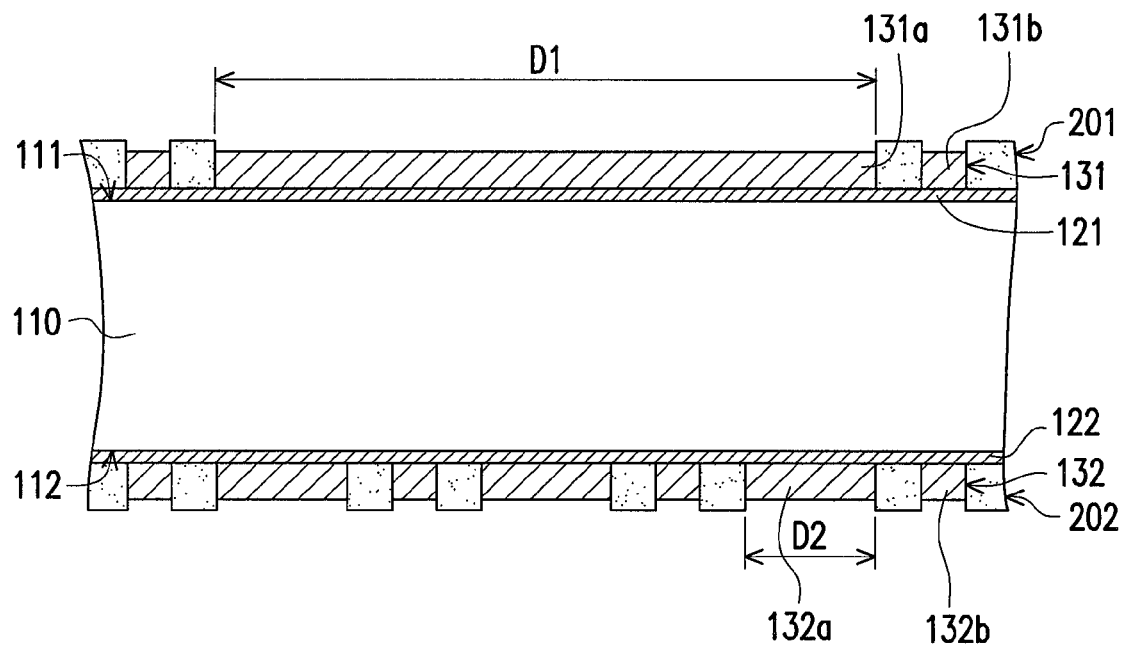

Then, referring to FIG. 1B, a first patterned conductive layer 131 is formed on the exposed portion on the first seed layer 121 by the plating process. The exposed portioned of the first seed layer 121 is defined by the first patterned photoresist layer 201. Similarly, a second patterned conductive layer 132 is formed on the exposed portion of the second seed layer 122 by the plating process. And, the exposed portion of the second seed layer 122 is defined by the second patterned photoresist layer 202.

The first patterned conductive layer 131 and the second patterned conductive layer 132 are formed through the same fabricating process and are with the same material, like copper as an example. The first patterned conductive layer 131 includes a first pad 131a and a first circuit trace 131b. The second patterned conductive layer 132 includes a second pad 132a and a second circuit trace 132b. In the embodiment, the outer diameter D2 of the second pad 132a is smaller than the outer diameter D1 of the first pad 131a. More specifically, the first pad 131a located on the first surface 111 can be connected to a mother board of an electronic device, and the second pad 132a located on the second surface 112 can be connected to a chip. Thus, the layout density on the second surface 112 is higher than that of the first surface 111.

Figure 1C:
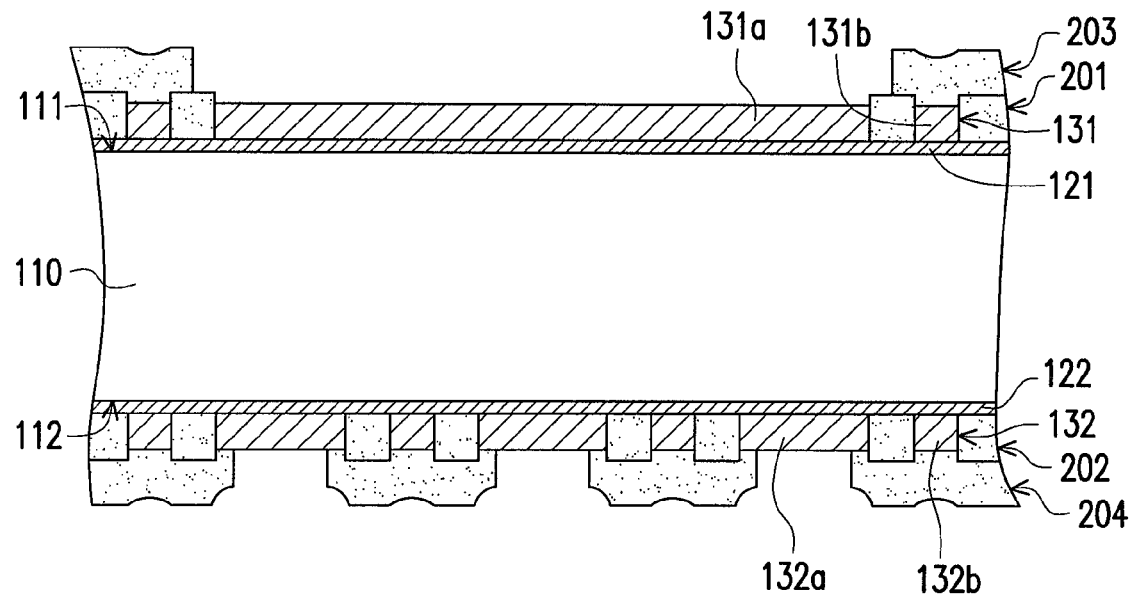

And then, referring to FIG. 1C, a third patterned photoresist layer 203 is formed on the first patterned photoresist layer 201 and the second patterned conductive layer 131, and a fourth patterned photoresist layer 204 is formed on the second patterned photoresist layer 202 and the second patterned conductive layer 132. The first pad 131a is exposed by the pattern of the third patterned photoresist layer 203 and the second pad 132a is exposed by the pattern of the fourth patterned photoresist layer 204. Further, the thickness of third patterned photoresist layer 203 and the thickness of the fourth patterned photoresist layer 204 might be adjusted for the requirement of designer. For example, the thickness of the third patterned photoresist layer 203 would be triple or more than that of the fourth patterned photoresist layer 204 in order to meet the different requirements of the BGA package process and the Flip-chip bonding process.

Figure 1D:
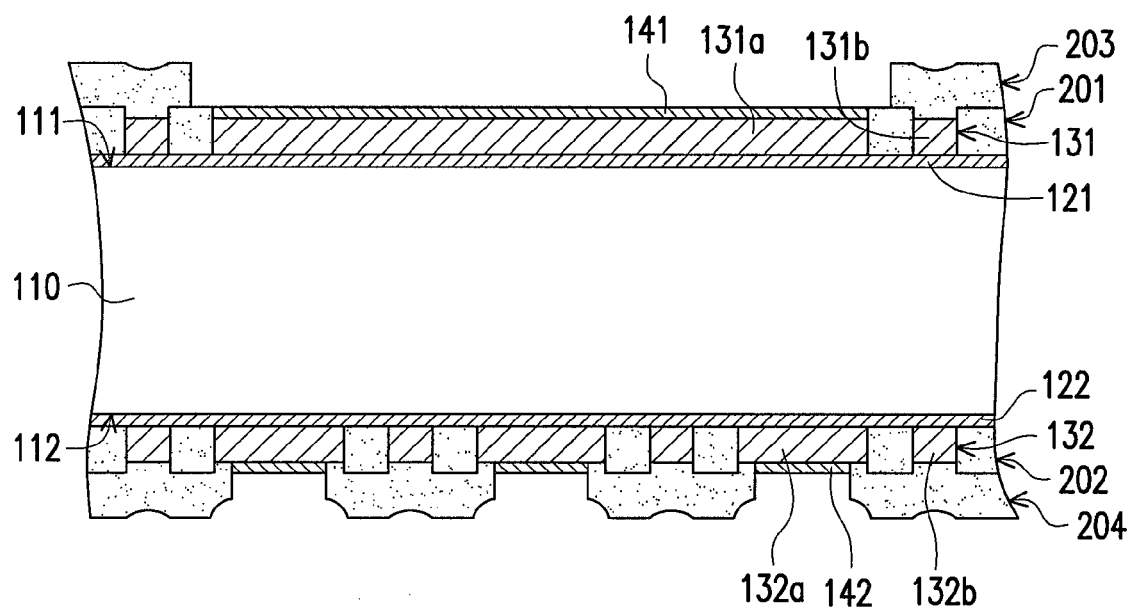

Referring FIG. 1D, a first barrier layer 141 is formed on the exposed portion of the first pad 131a, and a second barrier layer 142 is formed on the exposed portion of the second pad 132a. In the embodiment, the material of the first barrier layer 141 and the material of the first pad 131a are not the same, and the material of the second barrier layer 142 and the material of the second pad 132a are not the same. The material of the first barrier layer and the second barrier layer 142 is, for example, nickel, lead, tin, aluminum, magnesium, iron or an alloy thereof.

Figure 1E:
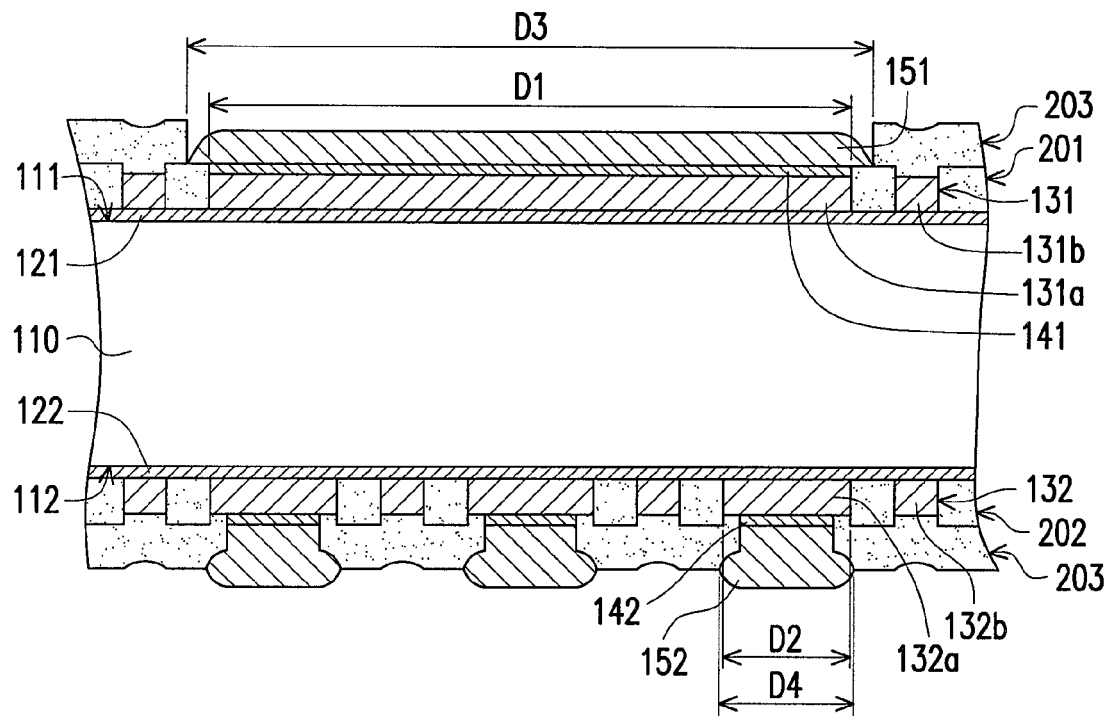

After that, referring to FIG. 1E, a first extending pad 151 is plated on the first barrier layer 141, and a second extending pad 152 is plated on the second barrier layer 142, which is defined by the pattern of the third photoresist layer 203 and that of the fourth photoresist layer 204 respectively. In the embodiment, the outer diameter D3 of the first extending pad 151 is greater than the outer diameter D1 of the first pad 131a, and the outer diameter D4 of the second extending pad 152 is greater than the outer diameter D2 of the second pad 132a. It should be noted that, in the embodiment, the material of the first extending pad 151 and the second extending pad 152 and the material of the first pad 131a and the second pad 132a are the same. The material is, for example, copper.

Figure 1F:
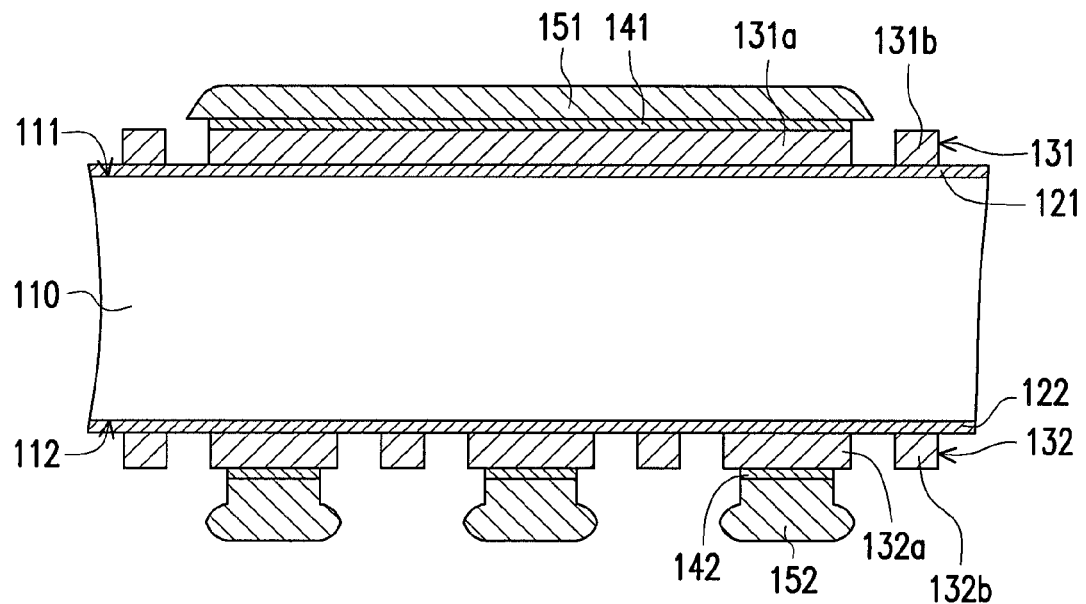
Figure 1G:
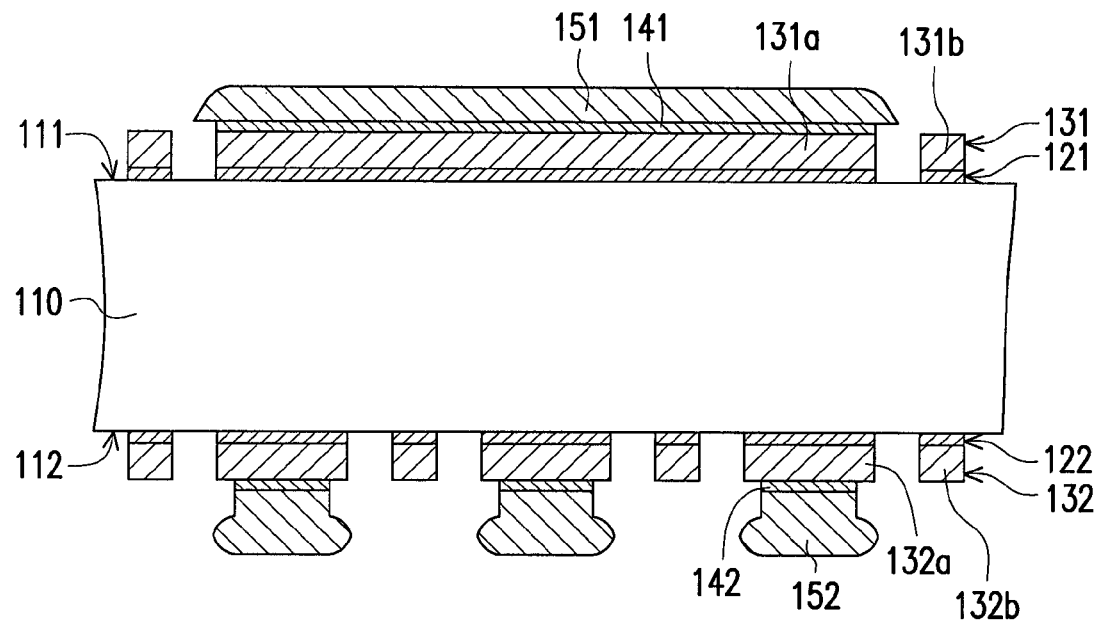

Then, referring to FIG. 1F, the first patterned photoresist layer 201, the second patterned photoresist layer 202, the third patterned photoresist layer 203 and the fourth patterned photoresist layer 204 are removed. Then, referring to FIG. 1G, portion of the first seed layer 121 which are not covered by the first patterned conductive layer 131 are removed, and portion of the second seed layer 122 which are not covered by the second patterned conductive layer 132 are removed.

Figure 1H:
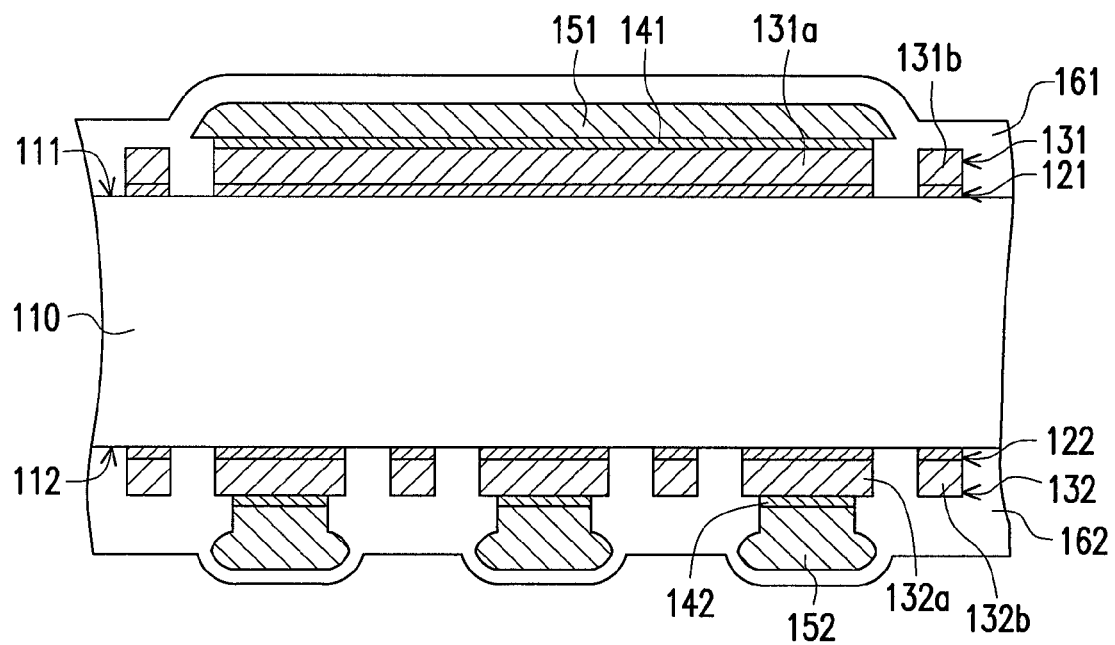

Referring to FIG. 1H, a first thermal-curing type dielectric layer 161 is formed on the first surface 111, and a second thermal-curing type dielectric layer 162 is formed on the second surface 112. In the embodiment, the first thermal-curing type dielectric layer 161 covers the first patterned conductive layer 131 and the first extending pad 151, and the second thermal-curing type dielectric layer 162 covers the second patterned conductive layer 132 and the second extending pad 152.

Figure 1I:
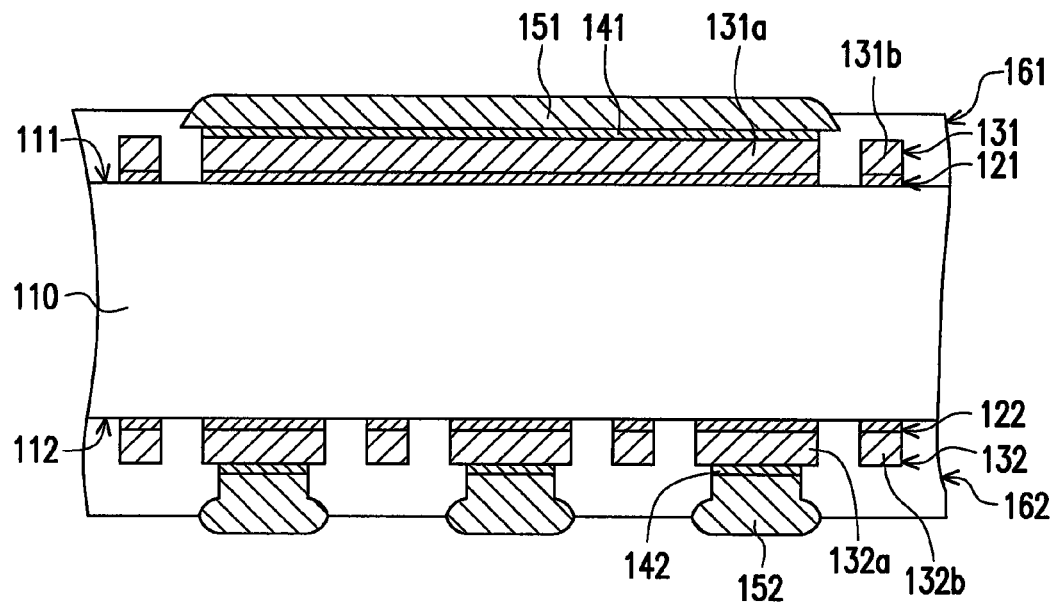

Referring to FIG. 1I, the thickness of the first thermal-curing type dielectric layer 161 is reduced, until part of the first extending pad 151 is exposed, and the thickness of the second thermal-curing type dielectric layer 162 is reduced until part of the second extending pads 152 are exposed. In the embodiment, a grinding process or a laser ablation process is used in the step of reducing the thickness of the first thermal-curing type dielectric layer 161 and reducing the thickness of the second thermal-curing type dielectric layer 162. In addition, the thickness of the first thermal-curing type dielectric layer 161 is smaller than the sum of the thickness of the first pad 131a and the thickness of the first extending pad 151, and the thickness of the second thermal-curing type dielectric layer 162 is smaller than the sum of the thickness of the second pad 132a and the thickness of the second extending pad 152.

Figure 1J:
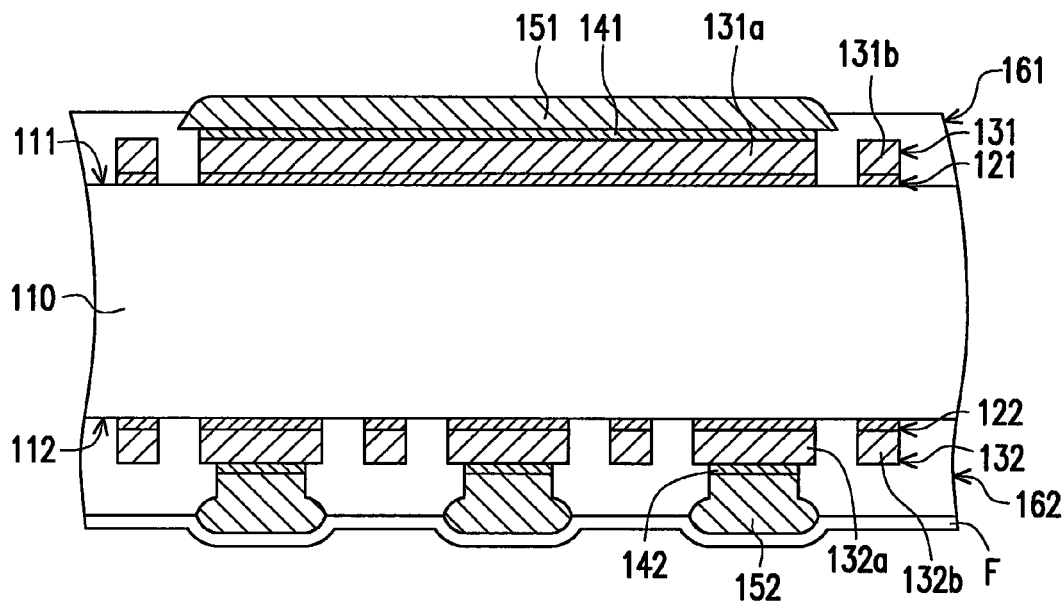
Figure 1K:
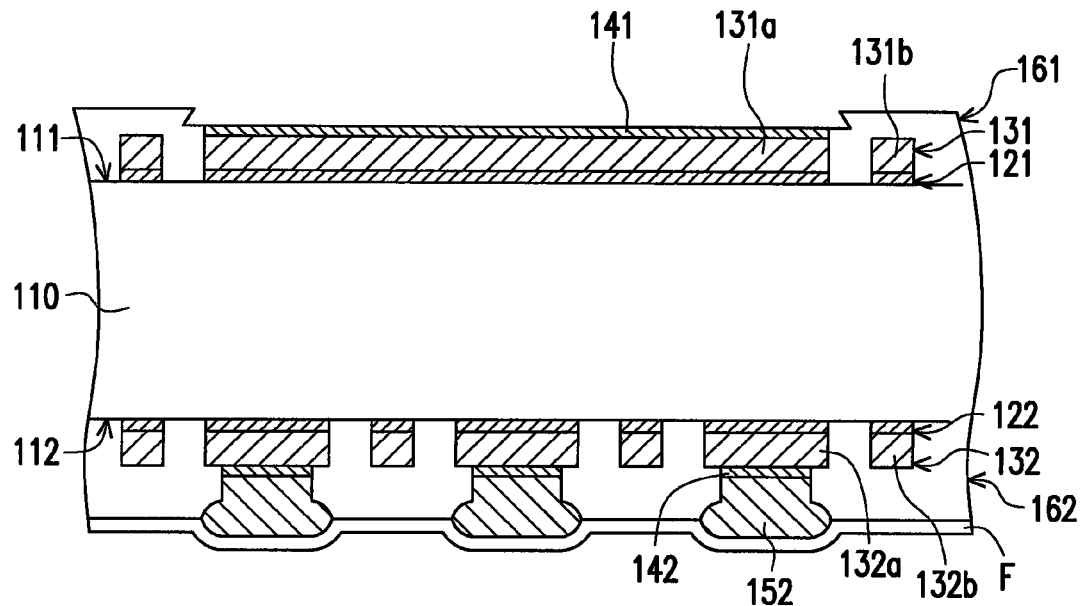

Referring to FIG. 1J, a removable protecting film F is formed on the second extending pad 152 and the second thermal-curing type dielectric layer 162. Then, referring to FIG. 1K, the first pad 151 is removed by using an etching process. Referring 1L, finally, the removable protecting film F is removed and the fabrication of the circuit board 100a of the embodiment is completed.

In the embodiment, the outer diameter D3 of the first extending pad 151 is greater than the outer diameter D1 of the first pad 131a, and thus the top surface of the first pad 131a is entirely exposed and not covered by the first thermal-curing type dielectric layer 161 after the first extending pad 151 is removed.

In the embodiment, the material of the first pad 131a and the material of the first extending pad 151 are the same, but the material of the first barrier layer 141 and the material of the first extending pad 151 are not the same. Therefore, in the step of removing the first extending pad 151, the first pad 131a is not removed due to the barrier of the first barrier layer 141.

In the embodiment, since the second extending pad 152 is covered by the removable protecting film F, the second extending pad 152 is also not removed in the step of removing the first extending pad 151. Certainly, the present invention is not limited thereto. In other embodiments, the first pad 131a and the first extending pad 151 can be made by different materials, and the second pad 132a and the second extending pad 152 can also be made by different materials.

In addition, to facilitate descriptions of the invention, the wording "top" represents being located at one outermost side of the core substrate instead of denoting substantial special limitation.

Figure 1L:
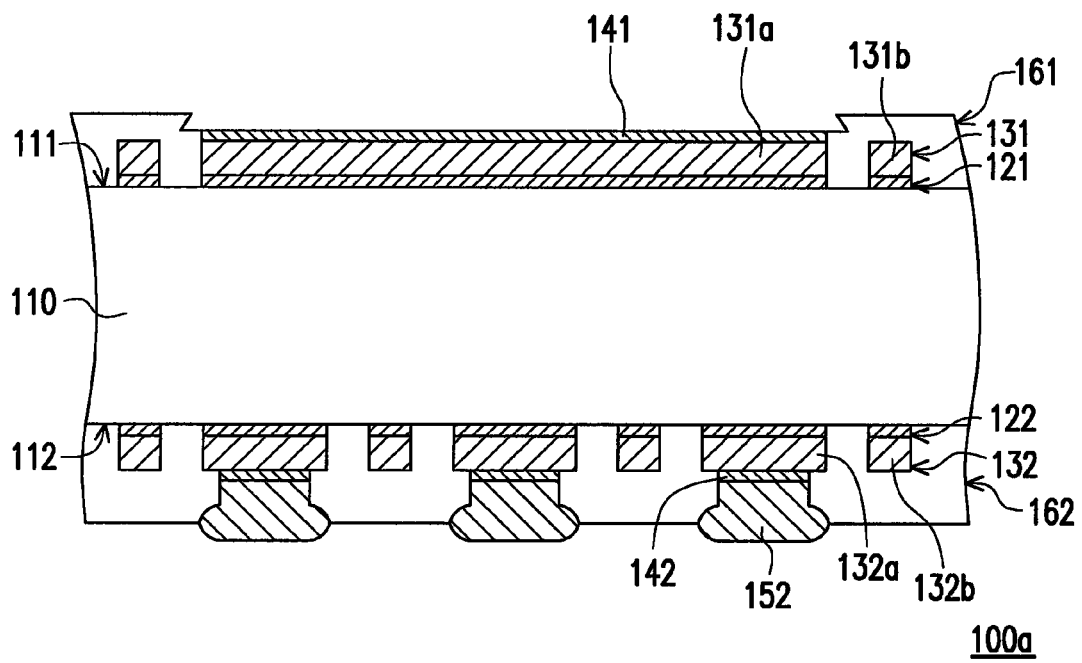

The structure of the circuit board 100a depicted in FIG. 1L is elaborated hereinafter. The circuit board 100a includes a core substrate 110, a first patterned conductive layer 131, a second patterned conductive layer 132, an extending pad 152, a first thermal-curing type dielectric layer 161 and a second thermal-curing type dielectric layer 162. The core substrate 110 has a first surface 111 and a second surface 112 opposite to the first surface 111. The first patterned conductive layer 131 is disposed on the first surface 111, and first pad 131a and first circuit trace 131b are formed in the first patterned conductive layer 131. The second patterned conductive layer 132 is disposed on the second surface 112, and second pad 132a and the second circuit trace 132b are formed in the second patterned conductive layer 132. The outer diameter D2 of the second pad 132a is smaller than the outer diameter D1 of the first pad 131a. The extending pad 152 is disposed on the second pad 132a, wherein the outer diameter D4 of the extending pad 152 is greater than the outer diameter D2 of the second pad 132a.

The first thermal-curing type dielectric layer 161 is disposed on the first surface 111 and covers the first patterned conductive layer 131. The thickness of the first thermal-curing type dielectric layer 161 is greater than the thickness of the first pad 131a. The second thermal-curing type dielectric layer 162 is disposed on the second surface 112, covers the second patterned conductive layer 132 and exposes the extending pad 152. The thickness of the second thermal-curing type dielectric layer 162 is smaller than the sum of the thickness of the second pad 132a and the thickness of the extending pad 152.

In the embodiment, the first thermal-curing type dielectric layer 161 exposes the entire top surface of the first pad 131a so as to form a non-solder mask define type pad (NSMD pad). The aforementioned solder mask is the first thermal-curing type dielectric layer 161.

Figure 2:
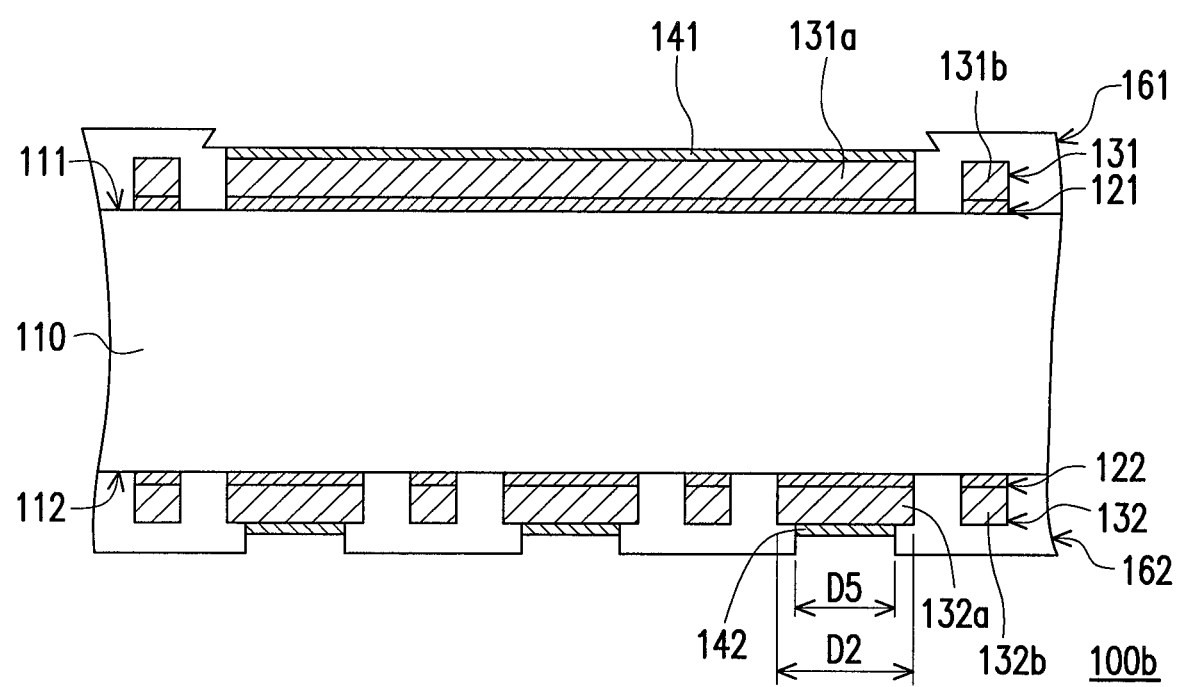
FIG. 2 is a cross-sectional view illustrating a fabrication process of a circuit board according to another embodiment of the present invention.

However, in the following embodiment, the fabricating method of a circuit board further includes removing the second extending pad 152. FIG. 2 is a cross-sectional view illustrating a fabrication process of a circuit board according to another embodiment of the present invention. Referring to FIG. 1A to FIG. 1I and FIG. 2, the steps illustrated in FIG. 1A to FIG. 1I are performed in the embodiment, and then, instead of disposing the removable protecting film F, the second extending pad 152 and the first extending pad 151 are simultaneously removed by the etching process until the second barrier layer 142 and the first barrier layer 141 are exposed. Then, the circuit board 100b shown in FIG. 2 can be obtained.

In the aspect of the structure, referring to FIG. 2 again, the outer diameter D5 of the second barrier layer 142 is smaller than the outer diameter D2 of the second pad 132a, and the second thermal-curing type dielectric layer 162 covers a portion of the second pad 132a and exposes a portion of the top surface of the second pad 132a.

Another embodiment is illustrated below. It has to be noted that the following embodiment incorporates with a part of content of the previous embodiment, wherein the same reference numerals are used for the same or similar components, and repeated descriptions of the same techniques are omitted. The omitted descriptions can be referred to the aforementioned embodiments and are not repeated in the following embodiment.

Figure 3A:
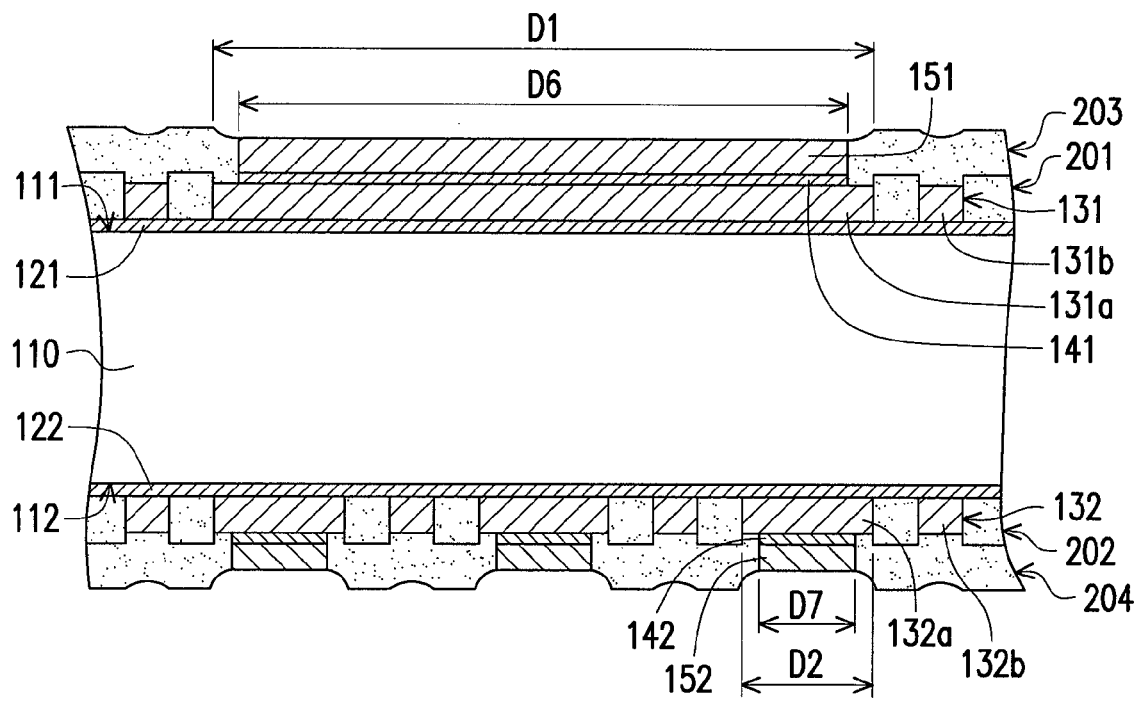
FIG. 3A to FIG. 3B are cross-sectional views illustrating a fabrication process of a circuit board according to another embodiment of the present invention.
Figure 3B:
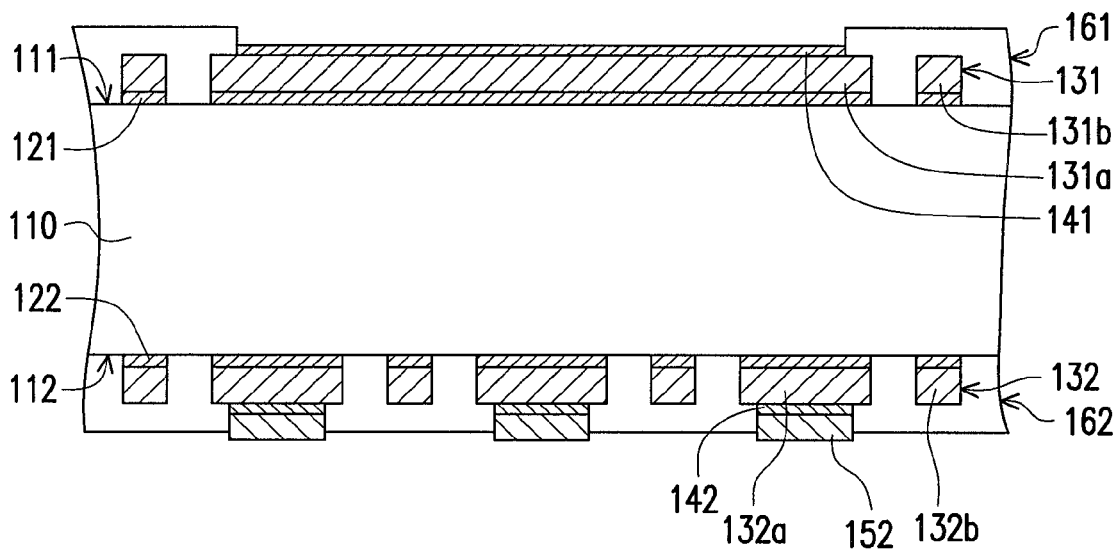

FIG. 3A to FIG. 3B are cross-sectional views illustrating a fabrication process of a circuit board 100c according to another embodiment of the present invention. Referring to FIG. 3A, this embodiment incorporates with the steps shown in FIG. 1A to FIG. 1E. Please note the features of this embodiment, the outer diameter D6 of the first extending pad 151 is smaller than the outer diameter D1 of the first pad 131a, which is achieved by controlling the size of the pattern in the third patterned photoresist layer 203 illustrated in FIG. 1D. And, the outer diameter D7 of the second extending pad 152 is smaller than the outer diameter D2 of the second pad 132a, which is achieved by controlling the thickness of the plated second extending pad 152 illustrated in FIG. 1E. After that, in incorporating with the steps shown in FIG. 1F to FIG. 1L, the structure illustrated in FIG. 3B would be obtained. Referring to FIG. 3B, after the first extending pad 151 is removed, a portion of the top surface of the first pad 131a is exposed by the first thermal-curing type dielectric layer 161, and the fabrication of the circuit board 100c is completed.

In the aspect of the structure, referring to FIG. 3B again, the circuit board 100c of the embodiment is similar in structure to the circuit board 100a of FIG. 1L, wherein the difference is that the first thermal-curing type dielectric layer 161 covers a portion of the first pad 131a and exposes a portion of the top surface of the first pad 131a. In other words, in the embodiment, the first thermal-curing type dielectric layer 161 exposes a portion of the top surface of the first pad 131a so as to form a solder mask define type pad (SMD pad). The aforementioned solder mask is the first thermal-curing type dielectric layer 161.

It should be mentioned that the structure located on the second surface 112 of the circuit board 100c is similar to the structure located on the second surface 112 of the circuit board 100a of FIG. 1L. However, the present invention is not limited thereto. In other embodiments, the structure located on the second surface 112 of the circuit board 100c can be designed as the structure located on the second surface 112 of the circuit board 100b of FIG. 2.

Figure 4A:
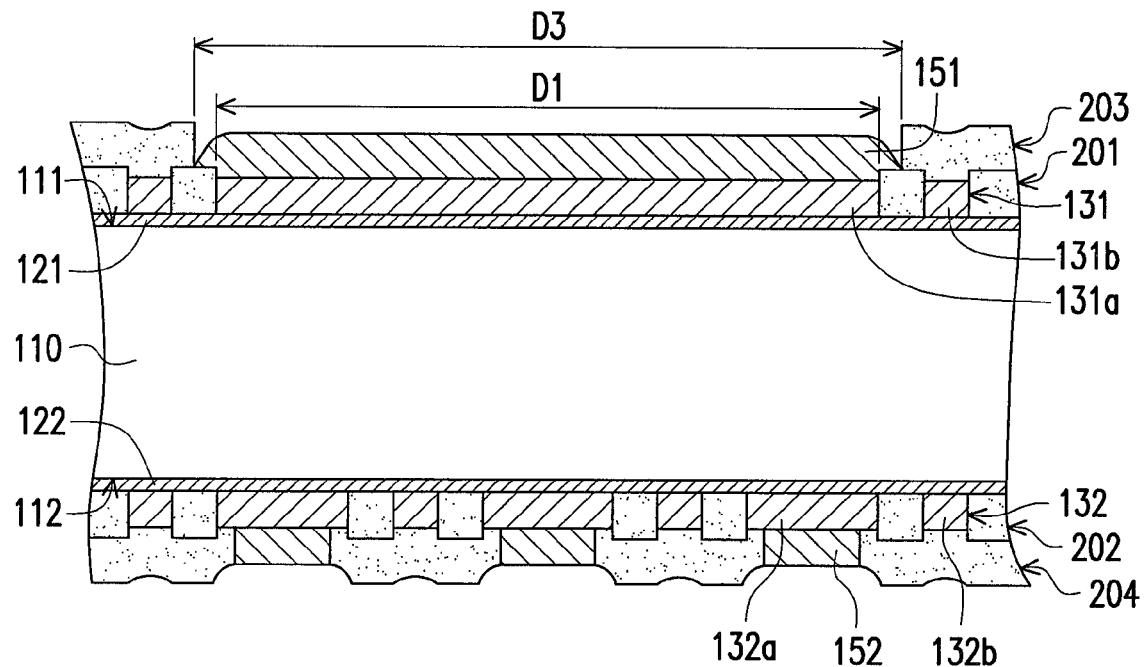
FIG. 4A to FIG. 4B are cross-sectional views illustrating a fabrication process of a circuit board according to another embodiment of the present invention.
Figure 4B:
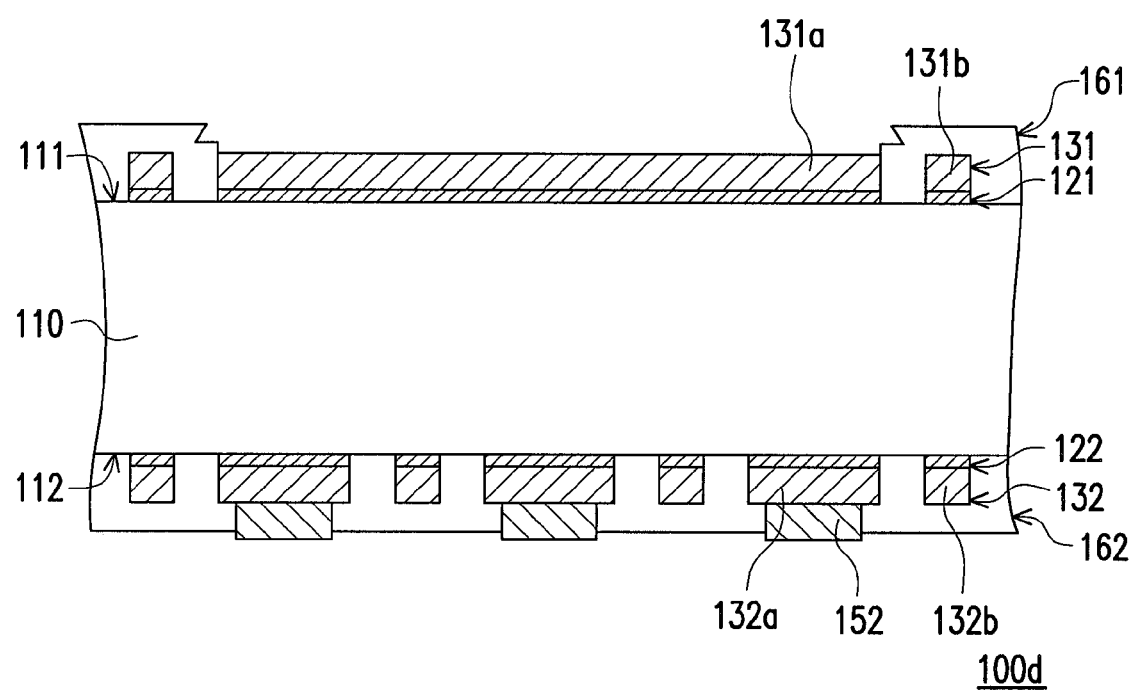

FIG. 4A to FIG. 4B are cross-sectional views illustrating a fabrication process of a circuit board according to another embodiment of the present invention. Referring to FIG. 4A, the embodiment incorporates with the steps of FIG. 1A to FIG. 1C and FIG. 1E. However, the difference in the embodiment is that the first extending pad 151 is directly formed on the first pad 131a and the second extending pad 152 is directly formed on the second pad 132a instead of forming barrier layers on the first pad 131a and the second pad 132a illustrated in FIG. 1D. The material of the first pad 131a and the material of the first extending pad 151 are not the same, and the material of the second pad 132a and the material of the second extending pad 152 are not also the same.

After that, incorporating with the steps shown in FIG. 1E to FIG. 1L, the structure illustrated in FIG. 4B is formed, and the fabrication of the circuit board 100d is completed. It has to be noted that, in the embodiment, since the material of the first pad 131a and the material of the first extending pad 151 are not the same, just choose the proper material-selective etching resolution having a high etching rate to the material of first extending pad 151, the first extending pad 151 can be removed in the condition of without affecting the first pad.

In the aspect of the structure, in the embodiment, the outer diameter D3 of the first extending pad 151 is greater than the outer diameter D1 of the first pad 131a, thus the circuit board having a similar structure with the circuit board 100a can be obtained. The omitted descriptions can be referred to the aforementioned embodiments and are not repeated in the following embodiment. However, in other embodiments, the outer diameter of the first extending pad 151 can be smaller than the outer diameter of the first pad 131a, thus the circuit board having a similar structure with the circuit board 100c can be obtained.

It should be mentioned that the structure located on the second surface 112 of the circuit board 100d is similar to the structure located on the second surface 112 of the circuit board 100c of FIG. 3B, but the second barrier layer 142 of the previous embodiment is omitted. However, the present invention is not limited thereto. In other embodiments, the structure located on the second surface 112 of the circuit board 100d can be designed as the structure located on the second surface 112 of the circuit board 100a of FIG. 1L but without the second barrier layer 142.

Moreover, though the pad of the circuit board in this embodiment is concave to the surface of the circuit board which is relatively away from the chip (the surface where the chip is not disposed), in other embodiments, the removable protecting film F can also be disposed to cover the first pad and the first extending pad, and the second extending pad can be removed by etching, so as to form a circuit board having a pad concave to the surface of the circuit board where the chip is disposed.

In light of the foregoing, the method of the present invention is capable of fabricating a circuit board having SMD pads and/or NSMD pads, and the above mentioned pads are concave to the surface of the circuit board to avoid causing scratches on the pad surface.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a circuit board, comprising:
providing a core substrate having a first surface and a second surface opposite to the first surface;
forming a first patterned photoresist layer on the first surface; forming a second patterned photoresist layer on the second surface;
plating a first patterned conductive layer on the first surface exposed by the first patterned photoresist layer, wherein the first patterned conductive layer has a first pad, the first pad extends in a plane where the first patterned conductive layer extends, and the first pad is configured to connect to a mother board of an electronic device;
plating a second patterned conductive layer on the second surface exposed by the second patterned photoresist layer, wherein the second patterned conductive layer has a second pad, and the second pad is configured to connect to a chip;
forming a third patterned photoresist layer on the first patterned photoresist layer and the first patterned conductive layer, wherein the third patterned photoresist layer exposes the first pad;
forming a fourth patterned photoresist layer on the second patterned photoresist layer and the second patterned conductive layer, wherein the fourth patterned photoresist layer exposes the second pad;
plating a first extending pad on the first pad exposed by the third patterned photoresist layer; plating a second extending pad on the second pad exposed by the fourth patterned photoresist layer;
removing the first patterned photoresist layer, the second patterned photoresist layer, the third patterned photoresist layer and the fourth patterned photoresist layer;
forming a first thermal-curing type dielectric layer on the first surface, wherein the first thermal-curing type dielectric layer covers the first patterned conductive layer and the first extending pad and entirely exposes a top surface of the first pad, and all side surfaces of the first pad is surrounded by the first thermal-curing type dielectric layer;
forming a second thermal-curing type dielectric layer on the second surface, wherein the second thermal-curing type dielectric layer covers the second patterned conductive layer and the second extending pad;
removing a portion of the first thermal-curing type dielectric layer covering a top of the first extending pad;
removing a portion of the second thermal-curing type dielectric layer covering a top of the second extending pad, wherein a thickness of the second thermal-curing dielectric layer is smaller than a sum of a thickness of the second pad and a thickness of the second extending pad, and the second extending pad completely fills the second thermal-curing dielectric layer for the second thermal-curing dielectric layer to expose the second extending pad; and
removing the first extending pad.

2. The method of fabricating a circuit board as claimed in claim 1, wherein a first seed layer is formed on the first surface before the step of forming the first patterned photoresist layer, so that the step of plating the first patterned conductive layer and the first extending pad is completed through the first seed layer; and after the step of removing the first patterned photoresist layer an exposed portion of the first seed layer is removed.

3. The method of fabricating a circuit board as claimed in claim 1, wherein a second seed layer is formed on the second surface before the step of forming the second patterned photoresist layer, so that the step of plating the second patterned conductive layer and the second extending pad is completed through the second seed layer; and after the step of removing the second patterned photoresist layer an exposed portion of the second seed layer is removed.

4. The method of fabricating a circuit board as claimed in claim 1, wherein an outer diameter of the first extending pad is greater than an outer diameter of the first pad, and a top surface of the first pad is entirely exposed by the first thermal-curing type dielectric layer after the step of removing the first extending pad.

5. The method of fabricating a circuit board as claimed in claim 1, wherein an outer diameter of the first extending pad is smaller than an outer diameter of the first pad, and a top surface of the first pad is partially exposed by the first thermal-curing type dielectric layer after the step of removing the first extending pad.

6. The method of fabricating a circuit board as claimed in claim 1, wherein a material of the first extending pad is the same as that of the first pad, a first barrier layer is plated on a portion of the first pad exposed by the third patterned photoresist layer before the step of plating the first extending pad, so that the first extending pad is plated on the first barrier layer thereafter, and in the step of removing the first extending pad the first extending pad is removed by using an etching process until the first barrier layer is exposed.

7. The method of manufacturing the circuit board as claimed in claim 1, wherein a material of the first extending pad is not the same as that of the first pad.

8. The fabrication method as claimed in claim 1, further comprising:
removing the second extending pad.

9. The method of fabricating a circuit board as claimed in claim 1, wherein a thickness of the first thermal-curing type dielectric layer is smaller than a sum of a thickness of the first pad and a thickness of the first extending pad, and a grinding process is used in the step of removing a portion of the first thermal-curing type dielectric layer covering a top of the first extending pad.

10. The method of fabricating a circuit board as claimed in claim 1, wherein a thickness of the second thermal-curing type dielectric layer is smaller than a sum of a thickness of the second pad and a thickness of the second extending pad, and a grinding process is used in the step of removing a portion of the second thermal-curing type dielectric layer covering a top of the second extending pad.

11. The method of fabricating a circuit board as claimed in claim 1, wherein a material of the second extending pad is the same as that of the first extending pad, a removable protecting film is formed on the second extending pad before the step of removing the first extending pad by using an etching process, and the removable protecting film is removed after the first extending pad is removed.

12. The method of fabricating a circuit board as claimed in claim 1, wherein an outer diameter of the second pad is smaller than an outer diameter of the first pad.

13. The method of fabricating a circuit board as claimed in claim 1, wherein an outer diameter of the second extending pad is greater than an outer diameter of the second pad.

14. The method of fabricating a circuit board as claimed in claim 8, wherein an outer diameter of the second extending pad is smaller than an outer diameter of the second pad, and a top surface of the second pad is partially exposed by the second thermal-curing type dielectric layer after the step of removing the second extending pad.

15. The method of fabricating a circuit board as claimed in claim 8, wherein a material of the second extending pad is the same as that of the second pad, a second barrier layer is plated on a portion of the second pad exposed by the fourth patterned photoresist layer before the step of plating the second extending pad, so that the second extending pad is plated on the second barrier layer thereafter, and in the step of removing the second extending pad the second extending pad is removed by using an etching process until the second barrier layer is exposed.

16. The method of manufacturing the circuit board as claimed in claim 8, wherein a material of the second extending pad is not the same as that of the second pad.

17. A circuit board, comprising:
a core substrate having a first surface and a second surface opposite to the first surface; a first patterned conductive layer disposed on the first surface and having a first pad, wherein the first pad extends in a plane where the first patterned conductive layer extends, and the first pad is configured to connect to a mother board of an electronic device; a second patterned conductive layer disposed on the second surface and having a second pad, wherein the second pad is configured to connect to a chip;
an extending pad disposed on the second pad, wherein an outer diameter of the extending pad is smaller than an outer diameter of the second pad;
a first thermal-curing type dielectric layer disposed on the first surface, covering the first patterned conductive layer and entirely exposing a top surface of the first pad, wherein all side surfaces of the first pad is surrounded by the first thermal-curing type dielectric layer; and a second thermal-curing type dielectric layer disposed on the second surface, covering the second patterned conductive layer and exposing the extending pad,
wherein a thickness of the second thermal-curing dielectric layer is smaller than a sum of a thickness of the second pad and a thickness of the extending pad, and the extending pad completely fills the second thermal-curing dielectric layer for the second thermal-curing dielectric layer to expose the extending pad.

18. The circuit board according to claim 17, wherein a thickness of the first thermal-curing dielectric layer is greater than a thickness of the first pad.

19. The circuit board as claimed in claim 17, wherein an outer diameter of the second pad is smaller than an outer diameter of the first pad.

20. The circuit board according to claim 17, further comprising a barrier layer, disposed on the first pad and between the second pad and the extending pad.

21. A circuit board, comprising:
a core substrate having a first surface and a second surface opposite to the first surface;
a first patterned conductive layer disposed on the first surface and having a first pad, wherein the first pad extends in a plane where the first patterned conductive layer extends, and the first pad is configured toe connect to a mother board of an electronic device;
a second patterned conductive layer disposed on the second surface and having a second pad, wherein the second pad is configured to connect to a chip;
an extending pad disposed on the second pad, wherein an outer diameter of the extending pad is smaller than an outer diameter of the second pad;
a first thermal-curing type dielectric layer disposed on the first surface, covering the first patterned conductive layer and entirely exposing a top surface of the first pad, wherein all side surfaces of the first pad is surrounded by the first thermal-curing type dielectric layer, and a thickness of the first thermal-curing type dielectric layer is greater than a thickness of the first pad; and
a second thermal-curing type dielectric layer disposed on the second surface and covering the second patterned conductive layer, wherein a thickness of the second thermal-curing dielectric layer is smaller than a sum of a thickness of the second pad and a thickness of the extending pad, and the second thermal-curing dielectric layer exposes the extending pad by completely filling the extending pad in the second thermal-curing dielectric layer.

* * * * *